(12) United States Patent
Yoneyama et al.

(10) Patent No.: US 8,525,283 B2
(45) Date of Patent: Sep. 3, 2013

(54) WAFER LENS ARRAY AND METHOD FOR MANUFACTURING THE SAME

(75) Inventors: Satoshi Yoneyama, Kanagawa (JP); Ryo Matsuno, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 13/044,090

(22) Filed: Mar. 9, 2011

(65) Prior Publication Data

US 2011/0221020 A1 Sep. 15, 2011

(30) Foreign Application Priority Data

Mar. 10, 2010 (JP) ................................. 2010-053125

(51) Int. Cl.
*H01L 21/00* (2006.01)

(52) U.S. Cl.
USPC .......................................... 257/432; 257/436

(58) Field of Classification Search
USPC .................. 257/432–448, E21.001, E31.003
See application file for complete search history.

(56) References Cited

U.S. PATENT DOCUMENTS

| 7,187,501 | B2 * | 3/2007 | Wakisaka | 359/622 |
| 7,645,628 | B2 * | 1/2010 | Perkins | 438/57 |
| 2004/0212719 | A1 * | 10/2004 | Ikeda | 348/340 |
| 2005/0030647 | A1 | 2/2005 | Amanai | |
| 2006/0044450 | A1 | 3/2006 | Wolterink et al. | |
| 2007/0275505 | A1 | 11/2007 | Wolterink et al. | |
| 2008/0054506 | A1 | 3/2008 | Rudmann et al. | |
| 2009/0174947 | A1 | 7/2009 | Hasegawa | |

FOREIGN PATENT DOCUMENTS

| JP | 05-209027 | 8/1993 |
| JP | 07-248404 | 9/1995 |
| JP | 09-137043 | 5/1997 |
| JP | 10-067970 | 3/1998 |
| JP | 10-298265 | 11/1998 |
| JP | 11-170315 | 6/1999 |
| JP | 2003-055316 | 2/2003 |
| JP | 2003-294912 | 10/2003 |
| JP | 2004-151363 | 5/2004 |
| JP | 2005-539276 | 12/2005 |
| JP | 2007-238883 | 9/2007 |
| JP | 2007-334018 | 12/2007 |
| WO | WO2004/027880 | 4/2004 |
| WO | WO2007/107025 | 9/2007 |

OTHER PUBLICATIONS

Extended European Search Report dated Apr. 2, 2013 in corresponding European Patent Application No. 11157293.9.

* cited by examiner

*Primary Examiner* — Cuong Q Nguyen
(74) *Attorney, Agent, or Firm* — Young & Thompson

(57) ABSTRACT

A wafer lens array comprising a plurality of lens sections arranged one-dimensionally or two-dimensionally, a substrate section connecting the lens sections, and gap sections, wherein the lens surfaces in the lens section each have one or more curved surfaces; the gap section is a part projecting from outside than the inner edge of the lens section; and the inner surfaces of the gap sections are spread from a side near the lens section to the other side.

15 Claims, 4 Drawing Sheets

(a)      (b)

WAFER LENS ARRAY AND METHOD FOR MANUFACTURING THE SAME

CROSS-REFERENCE TO RELATED APPLICATIONS

The present application claims the benefit of priority from Japanese Patent Application No. 053125/2010, filed on Mar. 10, 2010 and Japanese Patent Application No. 039995/2011, filed on Feb. 25, 2011, the contents of which are herein incorporated by reference in their entirety.

BACKGROUND OF THE INVENTION

1. Field of the Invention

The invention relates to a wafer lens array and a stack style wafer lens array. The invention also relates to a mold for manufacturing the wafer lens array and an apparatus for manufacturing the wafer lens array. In addition, the invention relates to a method for manufacturing a wafer lens array.

2. Description of the Related Art

Currently, portable terminals of electronic device such as mobile phone and PDAs (Personal Digital Assistant) are equipped with image pickup units which have small and thin shapes.

Such image pickup units generally include a solid-state image pickup device such as a CCD (Charge Coupled Device) image sensor or a CMOS(Complementary Metal-Oxide Semiconductor) image sensor, and lenses that form an image on the solid-state image pickup device. As mobile terminals become smaller and thinner, the image pickup units mounted on those are also required to achieve reduction in size and thickness. In order to decrease the cost of the portable terminals, improvement of productivity is desired. As a method for manufacturing such small lenses in large numbers, known is a method for lenses module comprising producing a wafer lens array comprising a substrate section and a plurality of lenses on the substrate section, cutting the substrate section to form pieces comprising a lens. By the method, lens modules can be mass-produced. Also known is a method for mass-manufacturing an image pickup unit comprising integrally combining a substrate section in which a plurality of lens sections are formed and a sensor substrate in which a plurality of solid-state imaging pickup device was form formed and cutting the sensor substrate with the substrate so that the unit comprises a lens and a solid-state imaging pickup device.

Heretofore, as the references concerning the wafer lens, knows are JP-T-2005-539276, WO07/107,025, JP-A-H7-248404, and JP-A-2003-294912. JP-T-2005-539276 discloses a multilayer-structure comprising stacked wafer lenses which comprise a substrate and a plurality of lenses on the substrate. WO07/107,025 discloses a method comprising feeding formation material on a substrate to form a lens on the substrate using a mold. As is different from the above wafer lens, a known article comprising a plurality of lenses is a micro lens array which does not integrally connect with the substrate. JP-A-H7-248404 does not use a mold for forming lenses since a resin layer which is formed on one side of a substrate is pressed and cured with a substrate comprising holes. JP-A-2003-294912 discloses a technique for forming a micro lens array comprising a two-layer structure, wherein the axes of the two layers adjusted to correspond to each other.

In the production of a wafer lens array composed of resin material, the resin material capable of curing through light or heat is generally cured inside a mold to product a wafer lens array. A plurality of wafer lens arrays is required to be stack to each other at a desired interval, wherein the plurality of wafer lens arrays has each a different shape in the lens section to each other. A method for sticking a plurality of wafer lens arrays to each other at a desired interval is exemplified by a method comprising sandwiching suitably selected gap material such as spacer between wafer lens arrays to adhere to each other, a method for dispersing particles into adhesive, or a method for improving a mechanical accuracy. However, those methods are concerned to increase of the cost due to increase of kinds of member to be used, and to demand of introduction of high-accuracy apparatus.

Therefore, the most desirable is to form gap sections on a wafer lens array itself from the viewpoint of the production cost. FIG. 1 is a schematic view showing a cross-section view perpendicular to the inner edge of the lens section of a conventional wafer lens array with gaps, wherein 1 stands for a lens, 2•2 stands for a substrate which connects the lenses to each other, and 3•3 stands for a gap which projects from the substrate 3 from a direction opposite to the lens 2. Such a wafer lens array with a gap was manufactured by the method shown in FIG. 2. FIG. 2 is a schematic view of methods for manufacturing a wafer lens array, wherein (a) shows a method for manufacturing a wafer lens array not comprising any gaps, and (b) shows a method for manufacturing a wafer lens array comprising gaps on the wafer lens array itself. In those methods, a mold 4 composed of glass, metal, or the like was pushed up to contact with resin 5, the resin was cured, and then, was released by moving the mold down. In the method for manufacturing the wafer lens array without gaps, the mold 4 is pushed up for forming sections corresponding to lenses (FIG. 2 (a)). Contrary to this, when the gaps are formed on the wafer lens array itself, the mold 4 is further pushed up for forming sections corresponding to gaps in addition to the sections corresponding to lenses (FIG. 2 (b)).

As mentioned above, the wafer lens array with gaps can be formed by an almost similar process to the process for manufacturing the wafer lens array without gaps. However, the production process for a wafer lens array with gaps produces a faulty product extremely more frequently, compared with the wafer lens array without gaps. In the case of the wafer lens array with gaps, when the resin is cured, and then, the mold is moved down to release the resin, the wafer lens array may be broken. This is because the resin and the mold each have different contraction percentage, and thereby, the wafer lens array gets hung up to a convex section inside the mold (a section corresponding to lens). In order to prevent the wafer lens array with gaps from being broken, it is demanded that the process is improved for the release of the resin from the mold. As a result, the yield of the wafer lens array with gaps decreases, or the takt time for releasing increases, and therefore, the cost becomes high.

JP-A-2004-151363 discloses a stacked lens array, wherein the lens arrays are bonded to each other by tightly fitting tapered concave portions and convex portions formed on each lens array when the lens arrays are stacked. However, in JP-A-2004-151363, the taper sections are tightly fitted to each other, and, as the result, the lens arrays may be broken or the taper sections may be shaved. When the lens arrays have a large size of surface area, it is difficult to adjust the distances between the individual lens arrays in one plane. That is, there is a problem in that the stacked lens arrays have sections which are completely fitted and sections which are not completely fitted. This causes reduction of properties for a lens unit. On the other hand, JP-A-2004-151363 discloses a resin-molded lens which is characterized by having a tapered shape in which the contour of a circular lens gradually becomes wide. However, JP-A-2004-151363 discloses a method for manufacturing only one lens and is silent to application to wafer lens array having sequentially-positioned lenses.

SUMMARY OF THE INVENTION

As mentioned above, for a lens unit which is manufactured by sticking two or three wafer lens arrays and which is finally cut into the individual lens units, in order to ensure optical properties, a distance between the lenses, that is, a gap is necessary to be formed in the case of the bonding of the wafer lens arrays. It is extremely desirable from the viewpoints of productivity that the method for manufacturing gaps on the wafer lens array itself is to push the mold up for forming only sections corresponding to lenses as shown in FIG. 2(b). However, since the mold and the resin each contract from molding to cooling and the contraction percentage of the mold is different from the contraction percentage of the resin, it is difficult to release the resin from the mold. The object of the invention is to avoid the problems and to provide a wafer lens array which itself does not get hung up to a mold and is easily released from the mold.

Under such a situation, the inventors have investigated and found that it is extremely difficult for the formation of conventional wafer lens arrays with gaps, to prevent the wafer lens array from being broken up even if technique for releasing the wafer lens from the mold is adjusted. The inventor considered to change a shape of the mold instead of the method for releasing it from the mold. There were corners in the mold as marked in FIG. 2(b). The inventors found that the cured resin not comprising the corners can be easily released from the mold. The inventors earnestly studied and found that the problem can be solved by forming the gap-forming section so that the gap-forming section projects from the substrate-forming section from outside than the outer edge of the lens-forming section in opposite direction from the lens-forming section.

Specifically, the problems were solved by the following means.

(1) A wafer lens array comprising a plurality of lens sections arranged one-dimensionally or two-dimensionally, a substrate section connecting the lens sections, and gap sections, wherein the lens surfaces in the lens section each have one or more curved surfaces; the gap section is a part projecting from outside than the inner edge of the lens section; and the inner surfaces of the gap sections are spread from a side near the lens section to the other side.

(2) The wafer lens array according to (1), wherein the wafer lens array is mainly composed of a curable resin.

(3) The wafer lens array according to (1) or (2), wherein the surfaces of the gap sections are parallel to a surface containing the inner edge of the lens section.

(4) The wafer lens array according to any one of (1) to (3), wherein the gaps have a uniform thickness to each other.

(5) The wafer lens array according to any one of (1) to (4), wherein the inner side of the gap section is spread linearly and/or in a curved line from a side near the lens section to the other side.

(6) The wafer lens array according to any one of (1) to (5), wherein the inner side of the gap section has a linear shape having a pitch of 100° or more to a surface containing the inner edge of the lens section and/or a circular shape of which a tangent line has a pitch of 100° or more to a surface containing the inner edge of the lens section.

(7) A stack style wafer lens array comprising the wafer lens array according to any one of (1) to (6) and a wafer lens array which are bonded to each other through surfaces of the gas sections.

(8) The stack style wafer lens array according to (7), wherein the wafer lens array is mainly composed of a curable resin.

(9) The stack style wafer lens array according to (7) or (8), wherein the surfaces of the gap sections are parallel to a surface containing the inner edge of the lens section.

(10) The stack style wafer lens array according to any one of (7) to (9), wherein the gap sections have a uniform thickness to each other.

(11) The stack style wafer lens array according to any one of (7) to (10), wherein the inner sides of the gap sections are spread linearly and/or in a curved line from a side near the lens section to the other side.

(12) The stack style wafer lens array according to any one of (7) to (11), wherein the inner sides of the gap sections have a linear shape having a pitch of 100° or more to a surface containing the inner edge of the lens section and/or a circular shape of which a tangent line has a pitch of 100° or more to a surface containing the inner edge of the lens section.

(13) The stack style wafer lens array according to any one of (7) to (12), wherein at least one wafer lens array is free from a gap section.

(14) A lens module obtained by dicing the stack style lens array according to any one of (7) to (13) into pieces.

(15) A image pickup unit comprising the lens module according to (14), a semiconductor substrate and an image element provide on the semiconductor substrate, wherein the substrate section is integrally bonded to the semiconductor substrate through a spacer.

(16) A mold comprising a lens-forming section comprising one or more convex portions, a substrate-forming section connecting the lens-forming section, a gap-forming section projecting from outside than the outer edge of the substrate-forming section in opposite direction from the lens-forming section, wherein the gap-forming section spreads from the substrate-forming section in opposite direction to the lens-forming section.

(17) The mold according to (16), composed of metal.

(18) The mold according to (16) or (17), which is used for manufacturing the wafer lens array according to any one of (1) to (6).

(19) An apparatus for manufacturing a wafer lens array, comprising a plurality of the molds according to any one of (16) to (18) arranged one-dimensionally or two-dimensionally.

(20) A method for manufacturing a wafer lens array with gaps, comprising using the mold according to any one of (16) to (18)

The invention made possible to efficiently provide a wafer lens array with gaps.

In the figures, 1 stands for a lens, 2 stands for a substrate, 3 stands for a gap, 4 stand for a mold, 5 stands for resin, 6 stands for a plate, 7 stands for a lens section, 7' stands for a lens surface, 8 stands for a substrate section, 9 stands for a gap section, 10 stands for an inner edge of the lens section, 10' stands for an outer edge of the lens section, 11 stands for a wafer lens array, 12 stands for a gap, 13 stands for a wafer lens array, 14 stands for an inner edge of a base part of a gap section, and 15 stands for an inner edge of a surface of a gap section.

BEST MODE FOR CARRYING OUT THE INVENTION

The contents of the invention are described in detail hereinunder. In this description, the numerical range expressed by the wording "a number to another number" means the range that falls between the former number indicating the lowermost limit of the range and the latter number indicating the uppermost limit thereof.

Figure 1:
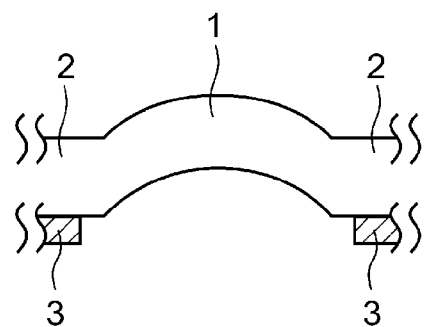
FIG. 1 is a schematic view showing a shape of a conventional wafer lens array with gaps, which is the schematic view of the cross-section surface perpendicular to a surface containing the inner edge of the lens section.
Figure 2:
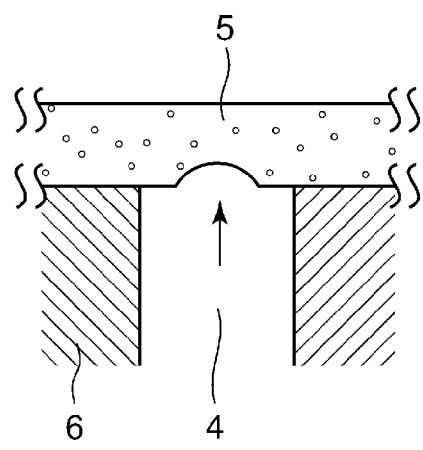
FIG. 2 is a schematic view showing a method for manufacturing a conventional wafer lens array, which is the schematic view of the cross-section surface perpendicular to a surface containing the inner edge of the lens section. The (a) shows a method for manufacturing a wafer lens array with no gap and the (b) shows a method for manufacturing a wafer lens array with gaps.
Figure 2:
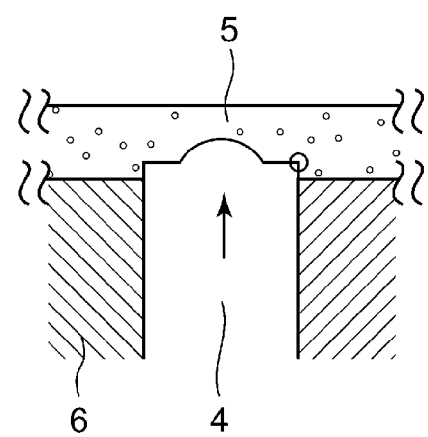
Figure 3:
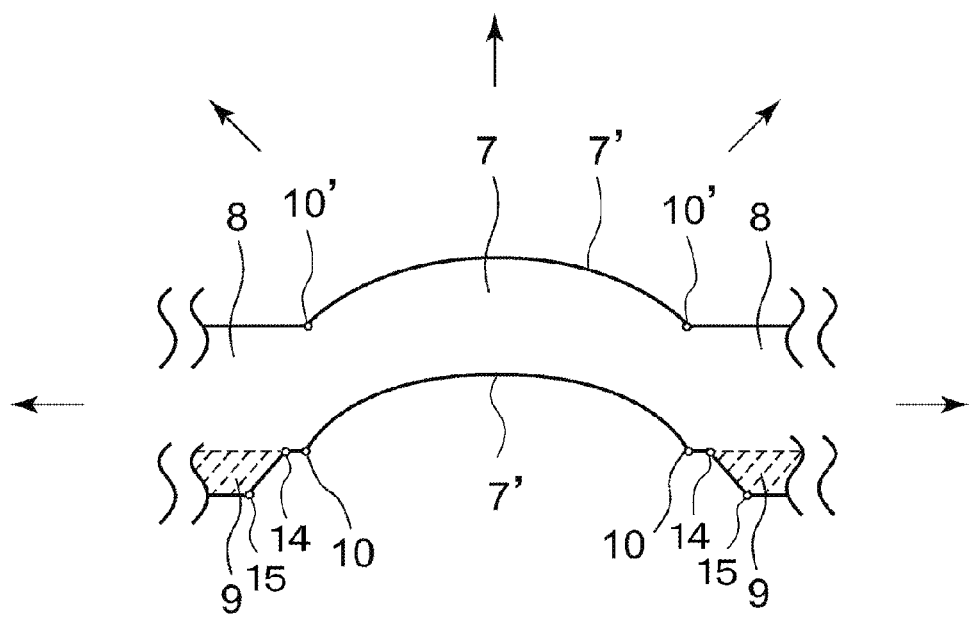
FIG. 3 is a schematic view showing a wafer lens array of the invention, which is the schematic view of the cross-section surface perpendicular to a surface containing the inner edge of the lens section.
Figure 4:
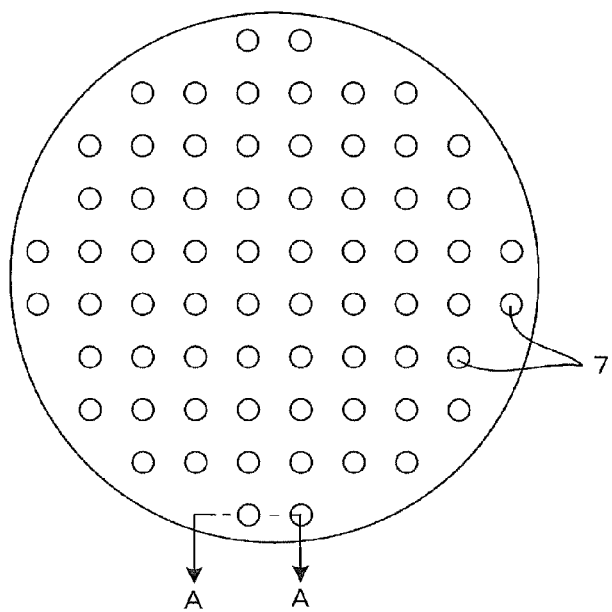
FIG. 4 is a schematic view showing a wafer lens array, wherein a plurality of lenses are arranged.

The wafer lens array of the invention comprises a plurality of lens sections which are arranged one-dimensionally or two-dimensionally, a substrate section connecting the lens sections, and gap sections, wherein the lens surfaces in the lens section each have one or more curved surfaces, the gap section is a part projecting from outside than the inner edge of the lens section, and the inner surfaces of the gap sections are spread from a side near the lens section to the other side. The inner edge of the surface of the gap section is positioned at outside than the inner edge of the base part of the gap section. Hereinunder, the invention is described in accordance with FIGS. 3 to 6. FIG. 3 shows a cross-sectional view of the surface perpendicular to a surface containing the inner edge of the lens section of the wafer lens array of the invention, wherein 7 stands for a lens section, 7' stands for a lens surface, 8 stands for a substrate section, 9 stands for a gap section, 10 stands for an inner edge of the lens section, 10' stands for an outer edge of the lens section, 14 stands for an inner edge of the base part of the gap section, and 15 stands for an inner edge of the surface of the gap section. FIG. 3 shows only one lens section for the convenience, but, actually the lens sections are arranged one-dimensionally or two-dimensionally. The wafer lens array has generally a shape as shown in FIG. 4. Each circles in FIG. 4 correspond to the lens sections 7. That is, the A-A cross-section view in FIG. 4 corresponds to FIG. 3. In the description, "inner" means the inner direction of gap section in one lens section, and is generally the concavity side of the lens section. "Outer" means the opposite side to the inner side, for example, the convexity side of the lens section. In the lens in FIG. 3, the direction that the arrows indicate is outer direction or outer side. Of course, the outer direction in the lens sections of the invention does not necessarily correspond to the outer direction in an article. A surface containing the inner edge of the lens section surface is a surface including the outer edge of the lens section or a surface containing the inner edge of the lens section. The outer edge of the lens section is the edge of the curved surface of the outer lens surface at the most outer side. The inner edge of the lens section is the edge of the curved surface of the inner lens surface at the most outer side. For example, in the lens in FIGS. 3, 5 and 6, the inner edge of the lens section corresponds to 10' and the outer edge of the lens section corresponds to 10. In general, the outer edge of the lens section and the inner edge of the lens section are circularity. The lens surface may have a surface other than a curved surface, as shown in (B), (C) and (D) in FIG. 5.

Figure 5:
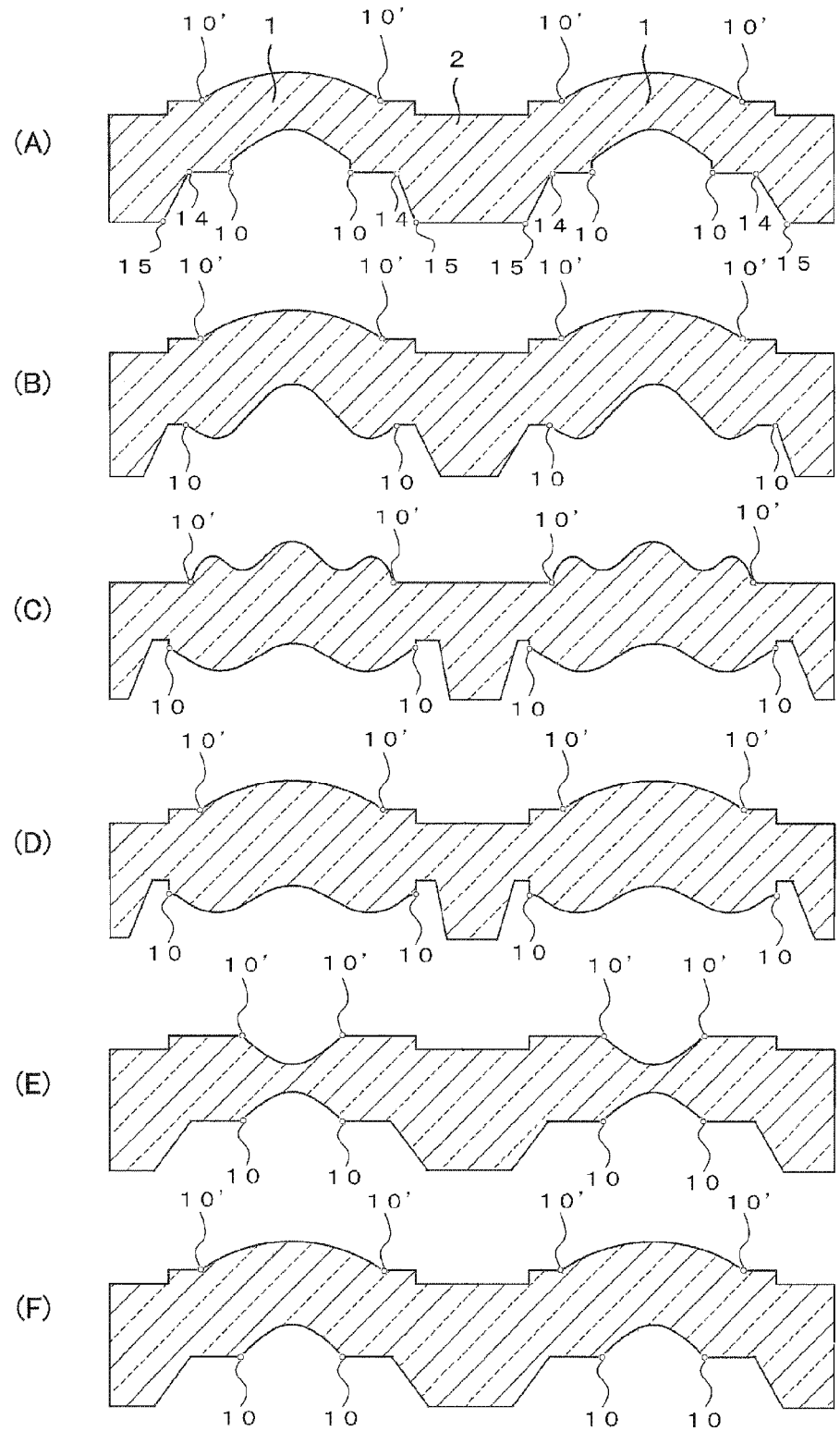
FIG. 5 is a schematic view showing wafer lens arrays each having various lens surfaces, which is the schematic view of the cross-section surface perpendicular to a surface containing the inner edge of the lens section.

The wafer lens array has lens surfaces 7' each having one or more curved surfaces. That is, the lens surface consists of a curved surface and/or a non-curved surface and may include an inflection point. The curved surface in the lens surface in the inner lens surface 7' is preferably provided so that the edges of the curved surface of the inner lens surfaces are positioned at the inner edge of the root part of the gap sections, respectively. Such a construction can be easily formed. Furthermore, the inner lens surface preferably does not have a convex portion at the side of the lens surface near the gap section. That is, such a construction as (A), (E) and (F) in FIG. 5 is more preferable to such a construction as (B), (C) and (D) in FIG. 5. When the lens surface does not have a convex portion at the side of the lens surface near the gap section, the lens is more easily released from the mold and hardly breaks.

The curved surface means that the cross-section thereof has a curved shape. As shown in FIG. 5, a shape of one lens surface may be different from a shape of the other lens surface. In the invention, one lens surface may have one or more curved surfaces. The shape of the lens section is not specifically limited to FIG. 5 and suitable selected in accordance with the use.

The wafer lens array has a substrate section 8 connecting the lens sections to each other. A plurality of the wafer lens arrays are stuck to each other, and then, the substrate sections are diced to the individual lenses.

The wafer lens array further has gap sections 9 which are a part projecting from the individual substrate section, wherein the projecting part is from the outer side than the inner edge 10 of the lens section. The direction of the projecting is preferably perpendicular to a surface containing the inner edge of the lens section. In FIG. 3, the gap sections correspond to the part shown by dotted-diagonal line and project from the substrate section. In general, the gap section and the substrate section are integrally manufactured, and therefore, there may be no clear boundary between the substrate section and the gap section. In the invention, the inner edge 15 of the surface of the gap section is positioned at outside of the inner edge 14 of the base part of the gap section, and the inner edge 14 of the base part of the gap section is positioned at outside of the inner edge 10 of the lens surface. The gap section 9 functions as a part which controls distance in optical design when a plurality of wafer lens arrays are bonded to each other. By providing the gap sections as the above, the lens can be stacked even if the gaps are not manufactured by using spacer or the like. This particularly improves production accuracy and productivity in the wafer lens array.

In the invention, the inner surface of the gap sections spreads from the side near the lens section to the other side. By employing such a construction, the cured resin easily released from the mold in the production and the breaking up of the cured resin can be effectively suppressed. When main material of the wafer lens array is curable resin and the mold to be used is composed of metal, the wafer lens array automatically comes out from the mold by its contraction at the curing of the curable resin, and therefore, the production process thereof is further simplified.

Figure 6:
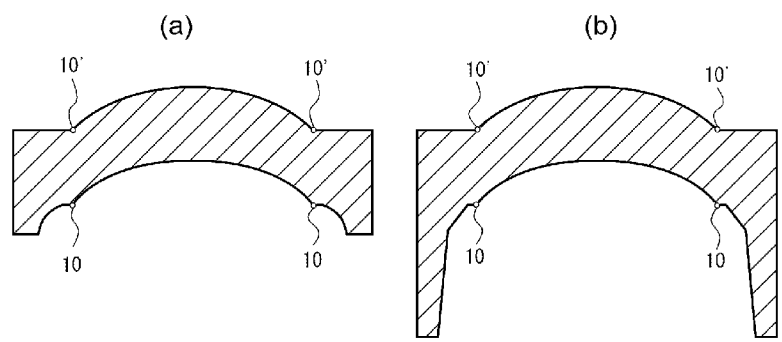
FIG. 6 is a schematic view showing various wafer lens arrays, which is the schematic view of the cross-section surface perpendicular to a surface containing the inner edge of the lens section.

In FIG. 3, the inner surface of the gap sections is linear, but cross-section of the inner surface may have another shape, which is exemplified by curved line shape. FIG. 6 shows examples of the shape of the cross-section of the inner surface, wherein (a) shows a circular arc shape and (b) shows a shape composed of two lines, which are different in angle to each other. Another example is a shape composed of two or more cured lines, which are different in curvature factor to each other. In generally, the shape of the cross-section of the inner surface has a shape composed of one or more lines and/or curved lines, which are different in angle or curvature factor to each other. Especially, the resin having a shape composed of two or more lines and/or curved lines comes out from the mold more easily. The cross-section of the inner surface of the gap section preferably has a linear shape having an inclination of 100° or more to a surface containing the inner edge of the lens section or a circular shape of which tangent line has an inclination of 100° or more to a surface containing the inner edge of the lens section. The inclination is preferably 150° or more to a surface containing the inner edge of the lens section. Preferably, the gap sections, the substrate section and the lens sections are concentrically positioned.

In general, the lens sections, the substrate sections and the gap sections on the wafer lens array are mainly composed of a curable resin. The composition in those sections preferably comprises 90% by weight of a curable resin, more preferably 95% by weight of a curable resin. Further more preferably, the curable resins of which the lens sections, the substrate section and the gap sections are composed have substantially same optical properties to each other.

Material of Wafer Lens Array

The wafer lens array for use in the invention is preferably obtained by curing a curable resin composition. The curable resin composition may be a heat-curable resin composition or a resin composition curable by irradiating an active energy ray such as ultraviolet ray or electron ray therewith. The resin composition preferably has a suitable flowability before cured in view of proper transcription of a mold and formability. Concretely, the composition is liquid at ordinary temperature and has a viscosity of about 1000 to 50000 mPa·s. The composition preferably has heat resistance to a degree that the composition after cured does not transform by heat and does not change its color when it is subject to reflow. From the above viewpoints, the cured article preferably has a glass-transition temperature of 200° C. or higher, more preferably 250° C. or higher, further more preferably 300° C. or higher. In order to give such high heat resistance to the resin composition, it is necessary to put restrictions on mobility at the molecular level. The effective measures include (1) increasing crosslink density per unit volume; (2) utilizing a resin having a rigid cyclic structure, which is exemplified by a resin having an alicyclic structure such as cyclohexane, norbornane and tetracyclododecane, an aromatic structure such as benzene and naphthalene, a cardo structure such as 9,9-biphenyl-florene, or a spiro structure such as spiro-biindaene, which are described in JP-A-H9-137043, JP-A-H10-67970, JP-A-2003-55316, JP-A-2007-334018 or JP-A-2007-238883; (3) uniformly dispersing a substance having high glass-transition temperature (Tg) such as inorganic particles, which are described in JP-A-H5-209027 or JP-A-H10-298265. Two or more of the means may not be combined with each other. To the means, an adjustment may be made without impairing other properties for flowability, shrinking ratio and refractive index. The resin composition preferably has a small volume shrinkage ratio based on a curing reaction from the viewpoints of accuracy of transcription of the shape to be formed. The curing shrinkage ratio of the resin composition for use in the invention is preferably 10% or less, more preferably 5% or less, further more preferably 3% or less.

In the invention, resins composing the substrate section, the lens sections and the gap section are preferably the substantively same optical properties to each other. The "resins are the substantively same optical properties" means that resins having the substantively same optical properties when the resins are cured. Herein, the substantively same optical properties to each other fall in that difference between refractive index thereof is in the range of 0.01 or less, and difference between Abbe number thereof is in the range of 5 or less. The difference between refractive index thereof is more preferably in the range of 0.005 or less, further more preferably 0.003 or less. The difference between Abbe number thereof is more preferably in the range of 2 or less, further more preferably 1 or less, still more preferably 0.

The maximal breadth of the lens section manufactured on the wafer level lens which is the widest distance between a terminal edge and the other edge in the lens section, is suitably adjusted depending on use thereof. In general, the maximal breadth of the lens section is preferably 50 µm or less, more preferably 40 µm or less. The thickness of adhesive for bonding the wafer lens arrays is preferably considered.

The surface of the gap sections in the wafer lens array of the invention is preferably parallel to a surface containing the inner edge of the lens section. The surface of the gap sections is a flat surface as the end of the gap section which is projected from the substrate section. When the surfaces of the gap sections are parallel to a surface containing the inner edge of the lens section, a plurality of the wafer lens arrays are accurately bonded to each other. For the same purpose, the thicknesses of the gap are preferably uniform to each other.

Stack Style Wafer Lens Array

Next, the stack style wafer lens arrays are described. The wafer lens arrays are generally used as a stack style wafer lens array by bonding the wafer lens array of the invention to a wafer lens array through the surfaces of the gap sections as a bonding surface.

Figure 7:
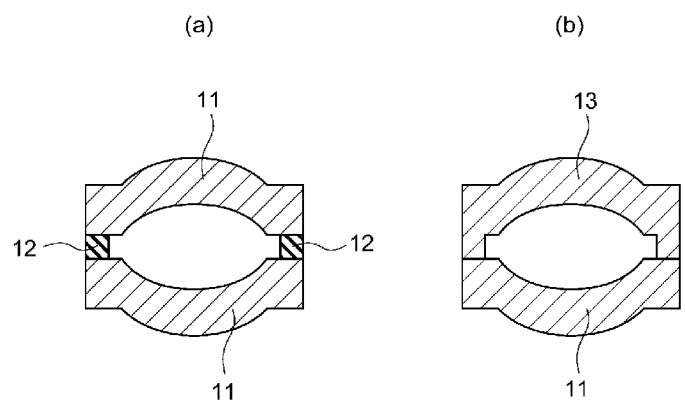
FIG. 7 is a schematic view showing an embodiment in which conventional wafer lens arrays are stuck to each other and an embodiment in which wafer lens arrays of the invention are stuck to each other, which is the schematic view of the cross-section surface perpendicular to a surface containing the inner edge of the lens section.

FIG. 7 shows a schematic view showing a construction in which a wafer lens array adheres to a wafer lens array, wherein FIG. 7(a) shows an embodiment in which a conventional wafer lens array adheres to a conventional wafer lens array, and FIG. 7(b) shows an embodiment in which a conventional wafer lens array with no gaps adheres to the wafer lens array of the invention. When the conventional wafer lens array 11 adheres to the conventional wafer lens array 11 as shown in FIG. 7 (a), it is needed to separately produce parts as gaps 12. In the invention, when the wafer lens array 13 of the invention adheres to the conventional wafer lens array 11 as shown in FIG. 7(b), it is not need to produce gaps since the gaps have already been manufactured. In FIG. 7(b), although the other wafer lens array is the conventional wafer lens array 11, the wafer lens array of the invention may be used instead of the conventional wafer lens array 11.

The wafer lens arrays are bonded to each other through adhesive. The adhesive may be suitably selected from photo-curable adhesive, thermal-curable adhesive, curable adhesive at room temperature and sheet type adhesive. For the purpose for accurately controlling the gap between the wafer lens arrays, adhesive in which particles are dispersed may be used. Preferably, the adhesive is black due to carbon dispersion and has light blocking effect. The adhesive section may be provided only on one side of one wafer lens array or on the both sides of one wafer lens array. When a plurality of wafer lens arrays are bonded to each other, the adhesive section is not necessarily provided on all the wafer lens arrays. When two wafer lens arrays are bonded to each other, the adhesive section thereof is preferably provided on bonding surface at one side of one of the wafer lens arrays. In the case of three wafer lens arrays, the adhesive sections are preferably provided on bonding surfaces at both sides of the interlayer. The bonding surface may be used as a portion which bonds the wafer lens array to a filter, a sensor, or a lens tube in addition to a portion which bonds the wafer level lens arrays to each other.

The individual wafer lens arrays are preferably different in optical properties and shape of lens from each other. Particularly preferably, the wafer lens arrays bonded to each other include at least two kinds of wafer lens array of which one has high Abbe number and another has low Abbe number. The high Abbe numbers that the wafer lens array may have is preferably 50 or more, more preferably 55 or more, further more preferably 60 or more. The refraction index that the wafer lens array may have is preferably 1.52 or more, more preferably 1.55 or more, furthermore preferably 1.57 or more. The low Abbe numbers that the wafer lens array may have is preferably 30 or less, more preferably 25 or less, further more preferably 20. The refractive index that the wafer lens array may have is preferably 1.60 or more, more preferably 1.63 or more, furthermore preferably 1.65 or more.

The shape of the lens may be suitably transformed depending on those optical properties. Prescribed lens surfaces are provided on the both sides of the lens sections. The lens surfaces are not limited to the convex spherical surfaces, and may be concave spherical surfaces, aspheric surfaces, or various combinations of the convex spherical surface, the concave spherical surface, and the aspheric surface.

The wafer lens array of the invention may be fabricated to a stack style wafer lens array, and then diced to form individual lens modules. Such a lens module is preferably applicable to an image pickup unit and the like. Examples thereof include an image pickup unit comprising the lens module of the invention, an image element and a semiconductor substrate on which the image element is provided, wherein the substrate section is integrally bonded to the semiconductor substrate through a spacer.

Mold

Next, the mold of the invention is described. The mold of the invention is characterized by comprising a lens-forming section comprising one or more convex portions, a substrate-forming section connecting the lens-forming section, a gap-forming section projecting from outside than the outer edge of the substrate-forming section in opposite direction from the lens-forming section, wherein the gap-forming section spreads from the substrate-forming section in opposite direction to the lens-forming section. Such a construction prevents the cured resin from being broken up by the mold when the cured resin is released from the mold. The wafer lens array of the invention can be easily manufactured by using the mold of the invention. The material composing the mold of the invention is not specifically limited, and is generally composed of metal or glass.

The invention also discloses an apparatus for manufacturing a wafer lens array comprising a plurality of such molds which are arranged one-dimensionally or two-dimensionally.

In the invention, a resin to be used as molding material is fed between the molds. Then, the molds are pressed to each other to form a wafer style resin, and the resin is cured through ultraviolet or heat irradiation in the condition that the resin is pressed, to thereby form a substrate section and lens sections. At that time, marking is preferably carried out in order to suitably stack the plurality of the wafer lens arrays. In particular, the invention is extremely advantageous in that the substrate section, the lens sections and the gap sections are integrally formed.

The invention makes it possible to effectively produce a wafer lens array with gaps. Further, when the wafer lens array composed of a curable resin is manufactured by using the mold of the invention, the resin itself (wafer lens array itself) contracts and is automatically released from the mold. Therefore, there is another advantage that the mold is not necessarily subjected to releasing treatment.

The present disclosure relates to the subject matter contained in Japanese Patent Application No. 053125/2010 filed on Mar. 10, 2010 and Japanese Patent Application No. 039995/2011, filed on Feb. 25, 2011, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A wafer lens array comprising:
a plurality of lens sections arranged one-dimensionally or two-dimensionally;
a substrate section connecting the plurality of lens sections; and
gap sections;
wherein lens surfaces in each of the plurality of lens sections each have one or more curved surfaces;
wherein each of the gap sections is a part projecting from outside an inner edge of each of the plurality of lens sections;
wherein inner surfaces of the gap sections are spread from a side near each of the plurality of lens sections to an other side;
wherein an inner lens surface of the one or more curved surfaces does not have a convex portion at a side of the inner lens surface near each of the gap sections.

2. The wafer lens array according to claim 1, wherein the wafer lens array is mainly composed of a curable resin.

3. The wafer lens array according to claim 1, wherein the surfaces of the gap sections are parallel to a surface containing the inner edge of the lens section.

4. The wafer lens array according to claim 1, wherein the gaps have a uniform thickness to each other.

5. The wafer lens array according to claim 1, wherein the inner side of the gap section is spread linearly and/or in a curved line from a side near the lens section to the other side.

6. The wafer lens array according to claim 1, wherein the inner side of the gap section has a linear shape having a pitch of 100° or more to a surface containing the inner edge of the lens section and/or a circular shape of which a tangent line has a pitch of 100° or more to a surface containing the inner edge of the lens section.

7. A stack style wafer lens array comprising:
a plurality of wafer lens arrays, wherein at least one wafer lens array of the plurality of wafer lens arrays comprises a plurality of lens sections arranged one-dimensionally or two-dimensionally;
a substrate section connecting the plurality of lens sections; and
gap sections projecting from outside an inner edge of the substrate section in direction perpendicular to a surface containing an inner edge of each of the plurality of lens sections;
wherein the lens surface in the lens sections have one or more curved surfaces;
wherein inner surfaces of the gap sections are spread from a side near each of the plurality of lens sections to an other side;
wherein the plurality of wafer lens arrays are bonded to each other through surfaces of the gap sections;
wherein an inner lens surface of the one or more curved surfaces does not have a convex portion at a side of the inner lens surface near each of the gap sections.

8. The stack style wafer lens array according to claim 7, wherein the wafer lens array is mainly composed of a curable resin.

9. The stack style wafer lens array according to claim 7, wherein the surfaces of the gap sections are parallel to a surface containing the inner edge of the lens section.

10. The stack style wafer lens array according to claim 7, wherein the gap sections have a uniform thickness to each other.

11. The stack style wafer lens array according to claim 7, wherein the inner sides of the gap sections are spread linearly and/or in a curved line from a side near the lens section to the other side.

12. The stack style wafer lens array according to claim 7, wherein the inner sides of the gap sections have a linear shape having a pitch of 100° or more to a surface containing the inner edge of the lens section and/or a circular shape of which a tangent line has a pitch of 100° or more to a surface containing the inner edge of the lens section.

13. The stack style wafer lens array according to claim 7, wherein at least one of wafer lens array is free from a gap section.

14. A lens module obtained by dicing the stack style lens array according to claim 7 into pieces.

15. A image pickup unit comprising the lens module according to claim 14, a semiconductor substrate and an image element provide on the semiconductor substrate, wherein the substrate section is integrally bonded to the semiconductor substrate through a spacer.

* * * * *